US012211583B2

(12) United States Patent
Partsch et al.

(10) Patent No.: US 12,211,583 B2
(45) Date of Patent: Jan. 28, 2025

(54) DATA-BUFFER CONTROLLER/CONTROL-SIGNAL REDRIVER

(71) Applicant: Rambus Inc., San Jose, CA (US)

(72) Inventors: Torsten Partsch, San Jose, CA (US); Shahram Nikoukary, Mountain View, CA (US); Catherine Chen, Cupertino, CA (US)

(73) Assignee: Rambus Inc., San Jose, CA (US)

( * ) Notice: Subject to any disclaimer, the term of this patent is extended or adjusted under 35 U.S.C. 154(b) by 152 days.

(21) Appl. No.: 18/021,442

(22) PCT Filed: Aug. 24, 2021

(86) PCT No.: PCT/US2021/047261
§ 371 (c)(1),
(2) Date: Feb. 15, 2023

(87) PCT Pub. No.: WO2022/051128
PCT Pub. Date: Mar. 10, 2022

(65) Prior Publication Data
US 2023/0298642 A1    Sep. 21, 2023

Related U.S. Application Data

(60) Provisional application No. 63/073,149, filed on Sep. 1, 2020.

(51) Int. Cl.
*G11C 5/02* (2006.01)
*G11C 7/10* (2006.01)
*G11C 7/22* (2006.01)

(52) U.S. Cl.
CPC .......... *G11C 7/1084* (2013.01); *G11C 7/1057* (2013.01); *G11C 7/222* (2013.01)

(58) Field of Classification Search
CPC .......... G11C 5/025; G11C 5/04; G11C 5/063; G11C 11/4097; G11C 7/18
(Continued)

(56) References Cited

U.S. PATENT DOCUMENTS 8,275,936 B1    9/2012   Haywood et al.
10,535,398 B2   1/2020   Shaeffer et al.
(Continued)

FOREIGN PATENT DOCUMENTS

WO    WO-2020-117481 A1    6/2020

OTHER PUBLICATIONS

Notification of Transmittal of the International Search Report and the Written Opinion of the International Searching Authority, or the Declaration with Mail Date Dec. 14, 2021 re: Int'l Appln. No. PCT/US2021/047261. 19 pages.

*Primary Examiner* — Son T Dinh
(74) *Attorney, Agent, or Firm* — Charles Shemwell (57) ABSTRACT

In a memory system having multiple memory sockets for removable insertion of memory modules therein, off-module data buffers are disposed in a data signaling data path between a memory control component and the memory sockets, and an off-module buffer controller is disposed in a control signaling path between the memory control component and the memory sockets. The off-module buffer controller receives control signals transmitted by the memory control component and re-drives/re-transmits the control signals to the memory sockets. The off-module buffer controller generates buffer-control signals in response to the control signals and outputs the buffer-control signals to the off-module data buffers to multiplex host-control-component access to the memory sockets.

20 Claims, 4 Drawing Sheets

(58) Field of Classification Search
USPC .................................................. 365/51, 63
See application file for complete search history.

(56) References Cited

U.S. PATENT DOCUMENTS

| | | | |
|---|---|---|---|
| 10,658,016 B1* | 5/2020 | Chang | G11C 7/225 |
| 10,679,722 B2* | 6/2020 | Helmick | G11C 29/52 |
| 2009/0175090 A1 | 7/2009 | Smolka | |
| 2016/0314822 A1 | 10/2016 | Yeung et al. | |
| 2017/0330610 A1 | 11/2017 | Ware et al. | |
| 2019/0043541 A1 | 2/2019 | Takefman et al. | |
| 2019/0079683 A1 | 3/2019 | Lee | |
| 2019/0088295 A1 | 3/2019 | Shaeffer et al. | |
| 2020/0034046 A1 | 1/2020 | Shallal et al. | |
| 2020/0201807 A1 | 6/2020 | Kinsley et al. | |

* cited by examiner

DATA-BUFFER CONTROLLER/CONTROL-SIGNAL REDRIVER

TECHNICAL FIELD

The present disclosure relates generally to data processing and more particularly to memory systems and components thereof.

DRAWINGS

The various embodiments disclosed herein are illustrated by way of example, and not by way of limitation, in the figures of the accompanying drawings and in which like reference numerals refer to similar elements and in which.

DETAILED DESCRIPTION

Modular memory systems having off-module data buffers disposed in a data signaling data path between a memory control component and two or more memory-module sockets together with an off-module data-buffer controller are disclosed herein in various embodiments. In a number of implementations, the off-module data-buffer controller ("buffer controller" for short) includes two data-buffer interfaces to output buffer-communication (BCOM) signals to respective "channel A" and "channel B' sets of off-module data buffers, and also includes a host interface coupled point-to-point with a memory control component and corresponding module interface coupled to control-signal contacts within the memory-module sockets. Internally, the buffer controller includes circuitry to both re-drive host control signals to on-module components (i.e., forwarding control signals received via the host interface for re-transmission via the module interface with various signal equalization and/or other signal-conditioning options) and to snoop those control signals for buffer control and system management purposes, including, without limitation, generation of off-module BCOM signals, management of signal training (timing calibration) operations, and buffer-controller configuration.

Disposition of the buffer controller in the control path between the memory control component and memory modules converts the otherwise lengthy, multi-drop path between those components (in which signaling energy is split between the routes to individual memory modules) into two high-integrity control path segments: a point-to-point control path segment between the memory control component and host interface of the buffer controller and a short-haul (short distance) multi-drop control path segment (or pair of point-to-point control paths) between the module interface of the buffer controller and socketed memory modules (e.g., sockets for dual inline memory modules, DIMMs or memory modules according to other form factors). The reduced loading and parasitic capacitance of the two control path segments (relative to conventional control path wiring from memory control component to module sockets) enables substantially increased control signal bandwidth—for example raising control signaling rates by 100% or more in memory systems having on-module register-clock drivers (and thus a single per-module termination point for control signals re-driven via the module interface of the buffer controller) and more specifically boosting control signal rates above 12 Gigabit per second (Gbps) or more, and thus well above the ~5-6 Gbps ceiling of conventional memory systems.

Memory modules supported by various off-module buffer controllers presented herein include, for example and without limitation, Registered DIMMs (RDIMMs) and Load-Reduced DIMMs (LRDIMMs) both of which include the aforementioned module-mounted RCD component (i.e., RCD coupled via socket contacts to receive control signals transmitted by the module interface of the buffer controller) and module-mounted memory IC packages. While the memory IC packages are generally depicted and described herein as dynamic random access memory (DRAM) packages that include one, two, four, eight or more individually selectable DRAM integrated-circuit dies, various other solid-state storage technologies may be implemented within the memory IC packages instead of or in addition to DRAM, including, without limitation, static random access memory (SRAM) and various forms of non-volatile memory (e.g., Flash memory, phase-change memory, magneto-resistive memory, etc.). In LRDIMM systems, each memory module includes, in addition to the RCD component and memory IC packages, a set of on-module data buffers with each such "module-resident" data buffer (MR DB or $DB_{MR}$) coupled, respectively, between an off-module data buffer (off-DIMM data buffer or "OD" data buffer or $DB_{OD}$) and one or more DRAM packages. RDIMM memory systems, by contrast, lack MR data buffers so that the OD data buffers are coupled directly to the module-mounted DRAM packages. In both LRDIMM and RDIMM memory systems, the off-DIMM data buffers constitute an intermediate destination for data signals transferred between the memory modules and host memory control component (i.e., "host component" which may be, for example, a processor IC having a memory control function, an application-specific integrated circuit (ASIC) having a memory control function or any other "memory controller") and the off-module/off-DIMM buffer controller ("OD controller") likewise represents an intermediate reception/re-transmission point for control signals destined to DIMM-resident RCD components (i.e., reducing the control path load perceived by the host control signal driver and thus enabling substantially higher control signaling rates as mentioned). As discussed below, the off-DIMM buffer controller additionally executes timing calibration operations (signaling training) as directed by the host component to enable reliable high speed signaling over the data and control signaling paths of the memory system. These and other features and embodiments are discussed in greater detail below.

Figure 1:
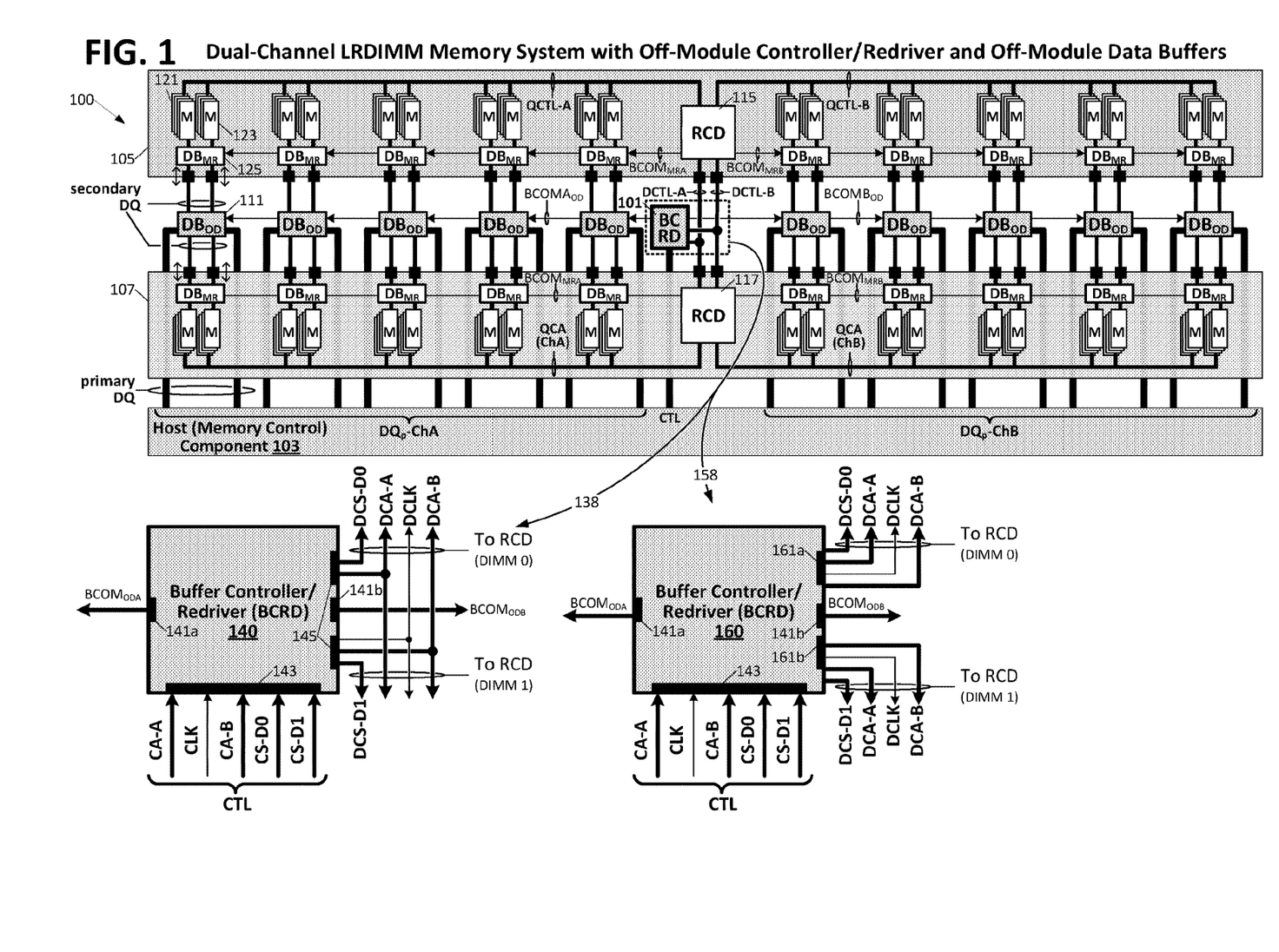
FIG. 1 illustrates an exemplary multi-channel load-reduced dual-inline memory module (LRDIMM) memory system having (i) an off-module buffer controller/redriver disposed in a control path between a host component and two socketed LRDIMMs.

FIG. 1 illustrates an exemplary multi-channel LRDIMM memory system 100 having (i) an off-DIMM buffer controller/redriver (BCRD) 101 disposed in the control path between a host component 103 and two socketed LRDIMMs 105, 107, and (ii) off-DIMM data buffers 111 ($DB_{OD}$) disposed in the data path between the host component and socketed LRDIMM. To implement the multiple memory channels (two in this case), the data links (DQ) between host component 103 and DIMM-mounted memory components (M) via off-DIMM data buffers 111 are split between two memory channels (i.e., channels 'A' and 'B' or "ChA" and "ChB") and control signals (CTL) issued to DIMM-mounted RCD components 115, 117 via buffer controller/redriver 101 are likewise split between two "control" channels (ChA, ChB). More or fewer memory channels and/or DIMM sockets may be supported in alternative embodiments.

Within each data channel, multiple sets of "primary" data links (primary DQ) are coupled point-to-point (PTP) between host component 103 and respective off-module data buffers 111, with two sets of "secondary" data links (secondary DQ) extending from each off-module data buffer to respective LRDIMM socket contacts (i.e., sockets in which LRDIMMs 105 and 107 are installed). By this arrangement, signals are conveyed point-to-point over the primary data links, reducing signal reflections/improving signaling integrity relative to multi-drop arrangements (i.e., in which each data link extends from a memory control component to multiple on-module data buffers, one per socket) and thus enabling potentially faster signaling rates. Within each control channel, control signaling links (e.g., command/address, chip-select, clock (CLK), clock enable, on-die termination control, etc.) are similarly coupled point-to-point between host component 103 and buffer controller 101 (the "host" control path). Buffer controller 101 redrives those control signals to the module-resident RCD components (115, 117) either via point-to-two-point (PT2P) control lines DCTL-A, DCTL-B as shown (i.e., in a multi-drop or parallel-connect arrangement with each signal conductor coupled to contacts within both LRDIMM sockets) or via dedicated point-to-point control lines to each DIMM socket.

Signaling rates over the host control path and/or DIMM control path (the latter between buffer controller 101 and RCDs 115, 117 via socket interconnects) may match or be lower (e.g., by a factor of 2, 4 or more) than those on the data links. Also, in a number of embodiments, buffer controller 101 receives and redrives control signals at double the clock cycle rate (i.e., sampling the host control path and driving the DIMM control path synchronously with respect to each rising and falling edge of CLK so that two bits or multi-bit symbols are conveyed per CLK cycle in a double-data-rate (DDR) transfer), while RCD components 115, 117 demultiplex incoming control signals (command/address signals in particular) for single data rate (SDR) transmission to memory ICs.

Still referring to FIG. 1, the primary data links extending between host component 103 and a given off-module data buffer 111 are split between low-order ("lower") and high-order ("upper") data lanes and each of the two sets of secondary data links extending between the off-module data buffer and a respective LRDIMM socket are likewise split between lower and upper data lines. Within a given memory module, constituent signaling links of the lower and upper data lanes are coupled to first and second sets of memory components (121, 123) via a module-resident data buffer 125. During a memory read or write operation, host-generated chip-select signals (i.e., a subset of the control signals, CTL) redriven by buffer controller 101 to module-resident RCD 115 (or RCD 117) and forwarded by the RCD to the memory components of a given channel will select/enable a specific one of the memory components within component set 121 and a specific one of the memory components within component set 123 to receive write data from or output read data to the corresponding off-module data buffer 111 via the secondary data links and module-resident data buffer 125. In the particular embodiment shown, each of the memory components is assumed to have a four-bit data interface, so that the upper and lower data lanes individually convey an upper nibble (four-bits) and lower nibble of data, respectively, and collectively convey a byte of data. As each memory module includes twenty (20) sets of memory components coupled to respective four-bit data lanes and split 10 sets apiece between first and second data channels, each data channel conveys 40 bits of data per bit transmission interval (i.e., $t_{BIT}$ or bit time). Additionally, in a number of embodiments, the constituent memory components of a given set coupled in common to a data lane are disposed in sufficiently close proximity to enable secondary signaling rates that match those on the primary data links—in this example at 6400 Mb/s per data link ($t_{BIT}$=156.25 picosecond). Moreover, memory components within a given set may be sufficiently proximal (e.g., physically stacked in a three-dimensional die stack, disposed in part on opposite sides of a relatively thin module substrate, etc.) to enable termination elements distributed within two or more of the memory components to effect a lumped link termination of the subject data lane (e.g., to match secondary link impedance and thus limit signal reflection) and/or to enable termination element(s) within any one or more of the memory components (or other integrated circuit die within a die stack or other multi-die arrangement) to effect a link termination for set of memory components as a whole.

In general, each of the 'A' and 'B' control channels from host component 103 to buffer controller 101 to RCDs 115, 117 (shown at buffer-controller output as DCTL-A and DCTL-B) conveys command/address (CA) and chip-select (CS) signals that are forwarded by module-resident RCD component over a corresponding secondary control channel (depicted as QCTL-A, QCTL-B) to control interfaces of individual memory components. In addition to command/address signals that indicate row operations (e.g., bank/row-address specified activation, precharge and refresh in the case of dynamic random access memory (DRAM) components) and column operations (e.g., bank/column-address specified data read or write within a column of an activated data page in a DRAM component), command signals may specify, for example and without limitation, various timing calibration operations (e.g., data receive and transmit operations within the DRAM components to enable the control component to adjust controller-internal transmit and receive timing domains for alignment with drifting timing domains within respective memory components), storage of various programming values (e.g., termination values to be applied by memory components) and system configuration information. Likewise, in addition to control signals that enable row and column operations within specific groups of memory components (e.g., chip-select signals that select one of N ranks of memory components to respond to a given command/address such that constituent memory components of the rank are operated in lock-step/parallel with respect to memory access operations) and provide timing (e.g., forwarded system clock that establishes timing domains within individual memory components), host-sourced control signals redriven to the LRDIMMs by buffer controller 101 may convey instructions to transition memory system 100 (including buffer controller 101, RCD components 115/117, off-DIMM data buffers 111, module-resident data buffers 125, and/or memory components 121/123) between hierarchical power-reduction states, control one-die termination application/timing and so forth. Also, while RCD components 115/117 are generally described herein as forwarding chip-select and command/address signals received from buffer control component 101, the RCD components may, in all cases, carry out decoding operations or otherwise derive or supplement command/address/control signals (to be output to the memory components and/or module-resident data buffers) in response to those supplied by buffer controller 101 and host component 103. As with the control signals, data signals output from or received by host component 103 generally include a diversity of signal types, including data signals bearing information received from or to be returned to a processor or other host functional component (i.e., "data per se"), "EDC" data signals bearing error detection/correction (EDC) information, data timing signals indicating a sampling instant within each bit interval and, in the case of a data strobe signal (DQS), intervals in which valid data is being conveyed over one or more data signaling links to which the data strobe signal corresponds.

Detail view 138 of FIG. 1 illustrates data buffer interfaces 141a/141b, host interface, 143 and PT2P DIMM interface 145 of an exemplary buffer controller/redriver (BCRD) 140. In the depicted example, control signals arriving at host interface 143 via corresponding control signal lines include, for example and without limitation, command/address (CA) for memory channel A (CA-A), CA for memory channel B (CA-B), chip-select (CS) for each DIMM, D0 and D1 (and for each of the two channels), and thus CS-D0 and CS-D1. The control signals further include a host-forwarded system clock signal (CLK) that is shared by the A and B memory channels (separate per-channel clocks may be supplied in alternative embodiments) and may include various other control signals not specifically shown (e.g., clock-enable, on-die termination control, low-speed side-band control such as I2C or I3C, data-bus invert, etc.). The data-buffer interfaces 141a/141b include signal drivers to output BCOM signals to the off-DIMM data buffers via paths $BCOM_{ODA}$ (channel A OD DBs) and $BCOM_{ODB}$ (channel B OD DBs), respectively, and the PT2P DIMM interface includes signal drivers to re-drive the host-supplied control signals (e.g., CLK, CA-A, CA-B, CS-D0, CS-D1) to module-resident RCD components, with those control signals renamed at the DIMM interface (i.e., DCLK, DCA-A, DCA-B, DCS-D0, DCS-D1) to emphasize their redriven character.

Detail view 158 illustrates an alternative BCRD embodiment 160 having the same data buffer interfaces 141a/141b (driving off-DIMM BCOM buses for channels A and B ($BCOM_{ODA}$, $BCOM_{ODB}$)) and host interface 143 as BCRD 140, but two point-to-point DIMM interfaces 161-a/161-b (each coupled point-to-point to a respective module-resident RCD) instead of the single PT2P DIMM interface 145 shown in embodiment 140. Internally, signal routing and control circuitry within BCRD 160 is identical to that of BCRD 140, with the exception of a replicated set of control signal drivers (e.g., CA-A, CA-B, DCLK) to enable control signal transmission to each DIMM via a dedicated set of BCRD-to-DIMM links.

Figure 2:
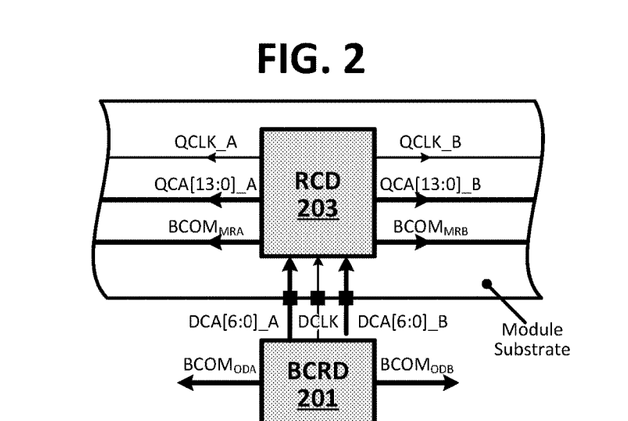
FIG. 2 illustrates exemplary interconnection of a buffer controller/redriver component and module-resident register-clock-driver component, showing in particular the command/address and clock signal inputs and outputs for those two components.
Figure 3:
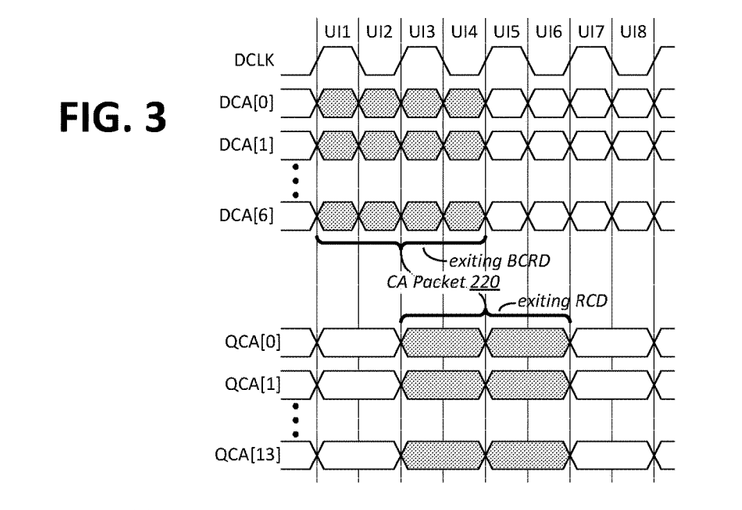
FIG. 3 presents an exemplary timing diagram corresponding to FIG. 2 and illustrating redistribution of the double-data-rate command/address signals output from the buffer controller/redriver component to the register-clock-driver component via respective channel A and channel B command/address paths into single-data-rate command/address signals output from the register-clock-driver component to module-resident memory components via double-width channel A and channel B on-module command/address paths.

FIG. 2 illustrates exemplary interconnection of a BCRD component 201 (e.g., according to either of the embodiments at 140, 160) and module-resident RCD component 203, showing in particular the command/address and clock signal inputs and outputs for those components. FIG. 3 presents a corresponding timing diagram illustrating redistribution of the double-data-rate command/address signals output from buffer controller 201 to RCD 203 (and originally supplied to BCRD by the host) via respective 7-bit channel A and channel B CA paths (i.e., DCA[6:0]_A, DCA[6:0]_B) into single-data-rate command/address signals output from the RCD to DIMM-resident memory components via respective 14-bit channel-A and channel-B CA paths (QCA[13:0]_A, QCA[13:0]_B). Thus, BCRD 201 redrives CA signals at the same data rate and via same-width CA paths as those incoming from the host, while RCD 203 re-times the CA signals into wider slower on-DIMM CA paths. In one embodiment, the BCRD-redriven clock signal (DCLK) is transmitted by RCD 203 without frequency change via separate A-channel and B-channel on-module clock lines (i.e., transmitting QCLK_A and QCLK_B to channel-A and channel-B memory ICs, respectively). In other embodiments, RCD 203 may frequency-divide the incoming DCLK to generate half-rate QCLKs (for channels A and B) so that the on-module CA paths are driven at double-data rate with respect to the QCLKs and at single data rate relative to the BCRD-redriven DCLK. In either case, a packetized command/address transmitted by BCRD 201 in a continuous sequence of bit times (or unit intervals (UIs)) corresponding to respective half cycles of the BCRD-redriven (and host sourced) clock signal—a 28-bit packet conveyed over 4 UIs in the 7-bit per-memory-channel CA example shown at 220—is conveyed over an equivalent (but time-delayed) interval in the half-rate, double-width on-module CA paths. Accordingly host-transmitted and BCRD redriven command/address packets may be transmitted back-to-back (no timing gap) and concurrently on each memory channel to produce a corresponding slower/wider back-to-back command packet transmission from the RCD component to individual memory components.

Figure 4:
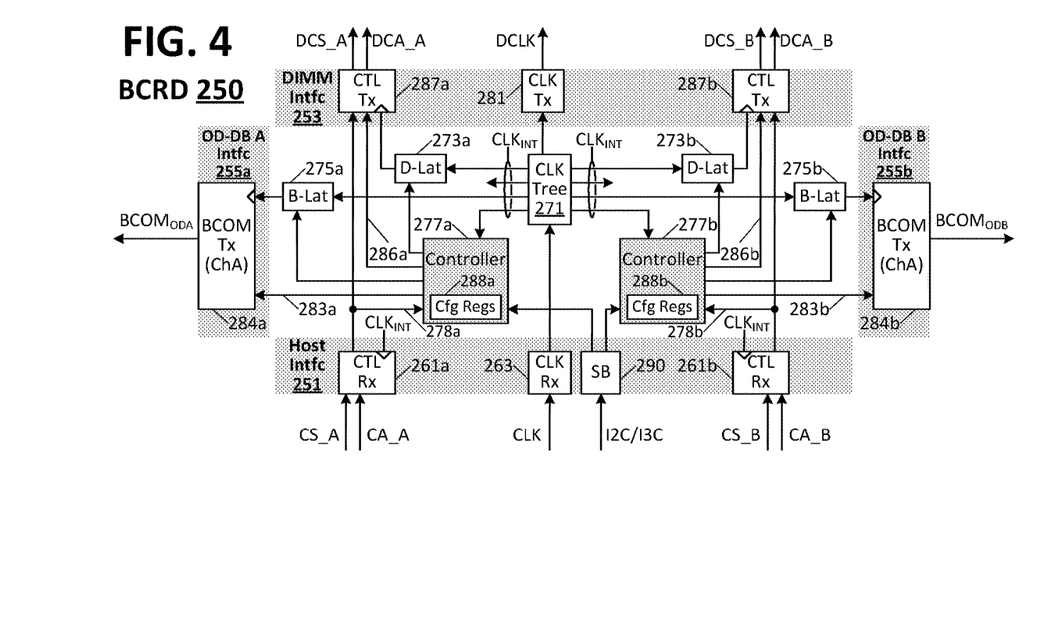
FIG. 4 illustrates a more detailed embodiment of a dual-memory-channel buffer controller/re-driver component having a host interface, DIMM interface, and off-DIMM data buffer interfaces.

FIG. 4 illustrates a more detailed embodiment of a dual-memory-channel buffer controller/re-driver component 250 having a host interface 251, DIMM interface 253, and off-DIMM data buffer interfaces 255a/255b generally as discussed above (e.g., PT2P DIMM interface as shown at 138 in FIG. 1, though replicated PTP DIMM interfaces for each of two or more DIMMs may be implemented). As shown, host interface 251 includes control signal receivers 261a and 261b to receive (sampling circuit, latch, register, etc.) command/address and chip-select signals for each of the 'A' and 'B' memory channels, respectively, and also a clock signal receiver 263 to receive the system clock (which may be viewed as a control signal or a separate timing signal). Clock receiver 263 forwards the system clock to a clock tree 271 which outputs multiple phase-adjusted instances of the system clock ($CLK_{INT}$) to internal circuitry—channel A/B latency control circuits 273a/275a and 273b/275b, respectively; channel-A controller 277a and channel-B controller 277b—and to the host interface control signal receivers 261a/261b and DIMM interface clock signal transmitter/redriver 281. In a number of embodiments, clock tree 271 lacks any drift compensation circuitry so that $CLK_{INT}$ may have a time-drifting phase relative to the host-supplied system clock, CLK (i.e., as propagation delays within clock tree elements increase/decrease with change in temperature and/or voltage). In such embodiments, startup time timing calibration operations are periodically/occasionally repeated to maintain desired alignment between the clock signal and corresponding control signals at various points within the memory system (i.e., CLK, $CLK_{INT}$, DCLK) within nominal drift tolerances.

Still referring to FIG. 4, per-memory-channel controllers 277a and 277b (which may alternatively be unified within a single multi-channel controller) snoop incoming control signals (command/address and chip-select) via snoop-paths 278a and 278b, respectively, to detect and respond to various host commands (e.g., having/implementing a finite state machine, sequencer or other control circuitry for that purpose). In the case of data transfer commands (i.e., memory read/write) issued via a given memory channel, the corresponding controller (277a or 277b) issues control signals to the data buffer interface (i.e., via buffer-control line 283a or 283b) to be transmitted to the off-DIMM data buffers (i.e., via $BCOM_{ODA}$ driver 284a or $BCOM_{ODB}$ driver 284b to make ready for read data or write data transfer between the host and DIMM data interfaces and indicate which of two or more DIMMs is to be accessed) and also outputs re-drive enable signals 286a or 286b to the control signal transmitter/re-driver circuits (287a or 287b, depending on channel being accessed) to enable the data transfer commands and corresponding chip-select signals to be retransmitted to the module-resident RCD components. Controllers 277a, 277b similarly enable re-transmission of commands to carry out internal memory-component control operations without external data transfer (e.g., DRAM row activation, DRAM programming) as well as commands to perform various maintenance operations within the DIMM-resident memory components and/or RCD (e.g., memory refresh, on-die termination adjustment, signal drive strength adjustment, timing calibration, etc.). As discussed in further detail below, controllers 277a/277b also respond to commands directed to buffer controller 250 itself including, for example and without limitation, commands to adjust timing delays imposed by latency control elements 273a/273b or 275a/275b during timing calibration operations (i.e., phase-adjusting retransmission of RCD-directed control signals and/or OD-DB directed control signals), and storing delay settings and/or other values within configuration registers 288a/288b that form part of or are coupled to controllers 277a/277b). Also, timing calibration commands may initially be conveyed to buffer controller 250 via a relatively low-speed (low frequency) sideband interface 290 (e.g., implemented according to various interface standards such as Inter-Integrated Circuit (I2C), SensWire (I3C), Serial Peripheral Interface (SPI), SMBus, etc.) to enable calibration of the host-to-BCRD control timing path, and thereafter may be conveyed via either the sideband interface or the high-speed control path (CA_A, CA_B, CS_A, CS_B). In all cases, configuration settings and/or timing calibration values may be recorded in any of various registers that form part of (or fields within) configuration registers 288a/288b.

Figure 5:
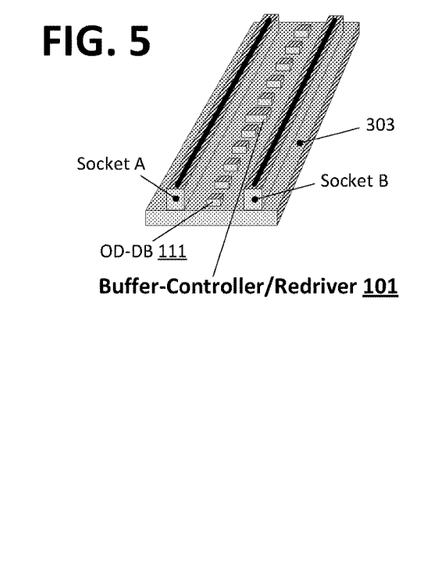
FIG. 5 illustrates an exemplary physical disposition of off-module data buffers and buffer controller/redriver between 'A' and 'B' memory module sockets.

FIG. 5 illustrates an exemplary physical disposition of off-module data buffers and buffer controller/redriver between 'A' and 'B' memory module sockets. In the depicted embodiment, the off-module data buffers and buffer controller/redriver are mounted to a mother board 303 or other system-scale printed circuit board and coupled to contacts within the A/B module sockets (also mounted on the motherboard) via wire traces formed on one or more motherboard layers. In a more integrated embodiment, the off-module data buffers and buffer controller/redriver may be disposed on a multi-socket assembly (or integrally formed multi-socket component) itself intended for mounting to a system-scale circuit board such as a motherboard or rack-mount blade.

Figure 6:
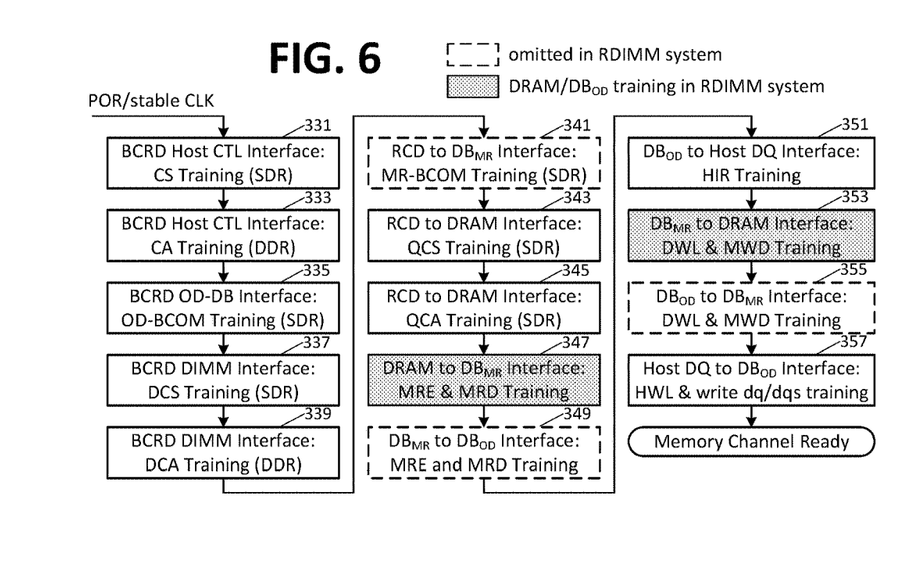
FIG. 6 illustrates an exemplary system timing calibration implemented via successive training operations within memory systems having buffer controller/redriver components according to embodiments herein.

FIG. 6 illustrates an exemplary system timing calibration implemented via successive training operations within memory systems having off-DIMM buffer controller/redriver components according to embodiments herein. After a power-on/reset event (power switched on or cycled) and delay sufficient for the system clock to stabilize, the host component issues an instruction to the buffer controller to calibrate the host interface—a two phase operation in which single-data-rate chip-select signal training is executed at 331 followed by a double-data-rate command/address training at 333. In both phases of the host interface calibration, the host issues an instruction to the BCRD to signal the training event, followed by transmission of the relevant signals (CS or CA) with progressively shifted phases. The BCRD samples the incoming signals and reports the sampled values back to the host (e.g., with commands and report back occurring through a low-speed sideband interface or a dedicated pin at this stage of the calibration) to enable determination of the margin-optimizing transmission timing (within the host component) and/or margin-optimizing signal sample timing within the BCRD component (the latter being recorded, for example, in a BCRD configuration register). After the host control to BCRD path has been trained/calibrated at 331/333, the host issues an instruction to the BCRD to train the BCRD-to-off-DIMM data buffer interfaces (e.g., setting one or more bits within a command conveyed via the control path to indicate that the BCRD component is being addressed so that the command need not, but may, be retransmitted to the DIMMs). The BCRD responds by executing OD-BCOM training (single data rate BCOM signals in the depicted example) at 335 to achieve calibrated BCOM signal timing for both A and B memory channels. Thereafter, the BCRD implements (in response to host commands) control signal training (e.g., chip-select signaling and command/address signaling) via the DIMM interface and thus between the BCRD and module-resident RCD, performing SDR timing calibration for redriven chip-select signals (DCS) at 337, and then DDR timing calibration for redriven command/address signals (DCA) at 337—operations carried out concurrently or sequentially for the 'A' and 'B' memory channels.

At this point, the BCRD forwards host commands to the on-DIMM RCD components to train their respective module-resident data-buffer interfaces (MR-BCOM) at 341. At 343 and 345, respectively, on-module chip-select signaling (i.e., adjusting the phase of QCS signals) and on-module command/address signaling (QCA) is trained between the RCD and all DRAM components for each DIMM. After completing the control signal training (e.g., chip-select and command/address signaling from host to BCRD, from BCRD to RCD and from RCD to DRAM components) as well as training the OD-BCOM and MR-BCOM interfaces, the host can reliably issue commands to all components in the system (i.e., BRCD, RCD, DRAM, $DB_{OD}$ and $DB_{MR}$ in the example shown). The remaining timing calibrations shown in FIG. 6 relate to data signaling paths between the module-mounted DRAM components and host data interface—including calibration of bidirectional data path segments between DRAMs and $DB_{MR}$ components (if the latter are present), $DB_{MR}$ components and $DB_{OD}$ components, and $DB_{OD}$ and host data interface.

In one embodiment, all remaining training operations are implemented/initiated by host issuance of mode register programming commands that trigger the relevant trainings. In the FIG. 6 example, for instance, the BCRD forwards host-supplied register programming commands to the module-mounted memory components and module-resident data buffers (i.e., via the module-resident RCD components) and then to the off-DIMM data buffers to carry out memory receive enable (MRE) and memory read delay (MRD) training between DRAM and $DB_{MR}$ (347) and between $DB_{MR}$ and $DB_{OD}$ (349), respectively. During MRE training, the data-signal receiving component ($DB_{MR}$ in 347 and $DB_{OD}$ in 349) adjusts the internal receive interval during which it samples the incoming DQS signals from the transmitting components (e.g. transmission triggered by host-commanded dummy reads), for example, by finding the DQS pre-amble. During MRD training, the data-signal receiving components trains/adjusts the internal DQS delay so it correctly latches the data sent from the transmitting component (DRAM in 347 and $DB_{MR}$ in 349). The transmitting component will, for example, send a known pattern during this training mode (e.g. from pre-programmed registers) to carry out MRE and MRD training for each rank on the DIMM.

Still referring to the FIG. 6 example, in the final task for training the data path in the read direction, the BCRD forwards commands to the off-DIMM data buffers (i.e., via OD-DB interfaces) to execute host interface read (HIR) training of the OD-DB-to-host component data path as shown at 351. HIR training may include, for example, one or more operations to train the receive DQS enable timing (i.e., "read leveling," analogous to MRE) and internal receive data latch timing (similar to MRD). The MRD (and HIR) trainings can be carried out with various level of granularity—adjusted, for example, per byte, per nibble or per bit (i.e., per DQ). One or more training patterns sent from DRAM, $DB_{MR}$ or $DB_{OD}$ may be, for example, set by pre-programmed register values via (e.g., host issuance of a mode-register set command, MRS) and/or a pseudo random pattern may be generated by the DB (e.g. by linear feedback shift register circuitry, LFSR), or the training data pattern may be hardwired.

After the read data path is successfully trained, the write data path can be trained. Thus, at 353, the BCRD forwards host commands to the module-mounted memory components and to the module-resident data buffers to execute DRAM write leveling (DWL) and memory write delay (MWD) training. During DWL, the $DB_{MR}$ components individually adjust the DQS delays so each DRAM correctly receives the data strobe (DQS). The MWD training adjusts the send-off delays (transmission timing) of the DQ relative to the DQS so that each DRAM can correctly latch the incoming write data. MWD can be carried out with various level of granularity—adjusted, for example, per DRAM, per byte, per nibble or per bit (i.e., per DQ). One or more training patterns sent from $DB_{MR}$ to DRAM may be, for example, set by pre-programmed register values via (e.g., host issuance of a mode-register set command, MRS) and/or a pseudo random pattern may be generated by the DB (e.g. by linear feedback shift register circuitry, LFSR), or the training data pattern may be hardwired. At this point, the BCRD forwards host commands to the module-resident and off-DIMM data buffers to carry out DWL and MWD training (355)—operations analogous to those shown at 353. At 357, the BCRD forwards host commands to the off-DIMM data buffers to carry out host-to-$DB_{OD}$ write leveling (HWL) and write data/data-strobe delay training (e.g., analogous to DWL and MWD), concluding the memory channel training so that mission-mode data access may begin. As discussed above, some or all of the above training operations may be periodically/occasionally carried out in whole or part to maintain desired timing alignment as operating temperature and voltage drift between specified limits. Also, as discussed below in reference to FIG. 10, the training operations shown in dashed outline (341, 349, 355) may be omitted in RDIMM systems (i.e., lacking module-resident data buffers) and the shaded training operations at 347 and 353 may be carried out between $DB_{OD}$ and DRAM components instead of DRAM/$DB_{MR}$. The host will adjust (choose) the training sequence based on the detected Memory/DIMM configuration in the system after a power-on/reset event (e.g. by reading the Serial Presents Detect memory SPD (not shown) on the DIMM(s)).

Figure 7:
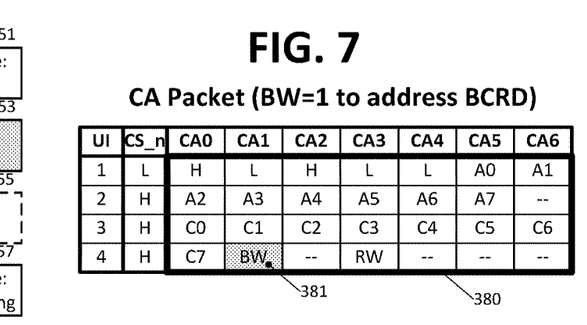
FIG. 7 illustrates an exemplary command/address packet in which an otherwise unused bit within a command/address packet is commandeered to enable commands to be directed to (as opposed to snooped by) a buffer controller/redriver component.

FIG. 7 illustrates an exemplary command/address packet 380 in which an otherwise unused (don't care) bit 'BW' (shown at 381) within a 4-UI, 28-bit CA packet is commandeered to enable commands to be directed to (as opposed to snooped by) the buffer controller/redriver component discussed above. The various allocation of other bits within or associated with the command packet—i.e., states of active-low chip select signals CS_n over the four UI interval, the disposition and number of row address bits A0-A7 and column address bits C0-C7, the disposition, number and state command code bits UI1/CA0-CA4=H|L|H|L|L (high, low, high, low, low), the disposition and number of bits provided to address on-module RCD components (i.e., bit 'RW') may all be different from those shown in alternative embodiments.

Figure 8:
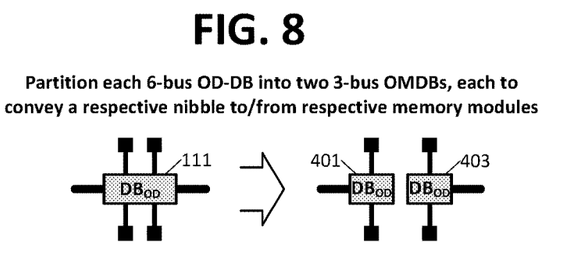
FIG. 8 illustrates an alternative implementation of the off-module data buffers discussed in reference to FIG. 1 in which each dual-data-path off-module data buffer is split into separate integrated circuit components each having a solitary data path such that data propagating through the off-module data buffer in a given memory access transaction is destined for (or received from) only one memory component slice rather than two parallel memory component slices.

FIG. 8 illustrates an alternative implementation of the off-module data buffers discussed above—splitting dual-data-path off-module data buffer 111 into separate integrated circuit components 401, 403 each having a solitary data path such that data propagating through the off-module data buffer in a given memory access transaction is destined for (or received from) only one memory component slice (e.g., via a module-resident data buffer in an LRDIMM memory system) rather than two parallel memory component slices—each memory component slice including one or more memory components ("memory component set"—for example two memory components disposed back-to-back on opposite faces of the memory module substrate) coupled in common to a set of data lines that is distinct from respective sets of data lines coupled to other memory component slices. The two integrated circuit data-buffer components 401, 403 may be implemented as discrete devices (e.g., soldered separately to landings on a motherboard or other substrate) or as side-by-side or stacked dies within a multi-die integrated circuit package. In either case, each off-module data buffer component 401 and 403 includes a primary data interface to be coupled to a respective portion of the host data interface and a secondary data interface to be coupled to either (i) a respective single-path module-resident data buffer, (ii) one of two data interfaces within a dual-path module-resident data buffer or (iii) directly to the data interface a module-mounted memory component. Additional secondary data interfaces may be provided in off-module data buffer components to be deployed in memory systems having three or more memory sockets (module-resident data buffers may also have more than two secondary interfaces according to attached memory component count).

Figure 9:
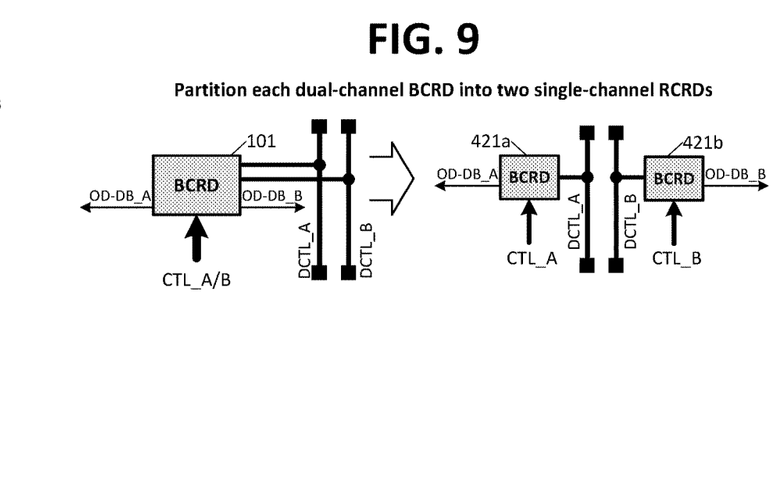
FIG. 9 illustrates an exemplary splitting of a dual-channel buffer controller/redriver component into two distinct single-channel buffer controller/redriver components.

FIG. 9 illustrates an exemplary splitting of a dual-channel buffer controller/redriver component 101 into two distinct single-channel BCRD components 421a, 421b. In one embodiment, each single-channel BRCD component 421a, 421b is implemented generally as shown by either half of FIG. 4 BCRD component 250. That is, each BCRD component 421a and 421b includes a host interface to receive single-channel control signals (e.g., CS_A/CA_A or CS_B/CA_B), a clock signal and a sideband control signal; a single OD-BD interface for the corresponding memory channel; and per-channel internal controller and control-signal redriver circuitry as shown in FIG. 4. As with the split off-DIMM data buffer components in FIG. 8, the single-channel BCRD components 421a/421b may be implemented as discrete devices (e.g., soldered separately to landings on a motherboard or other substrate) or as side-by-side or stacked dies within a multi-die integrated circuit package.

Figure 10:
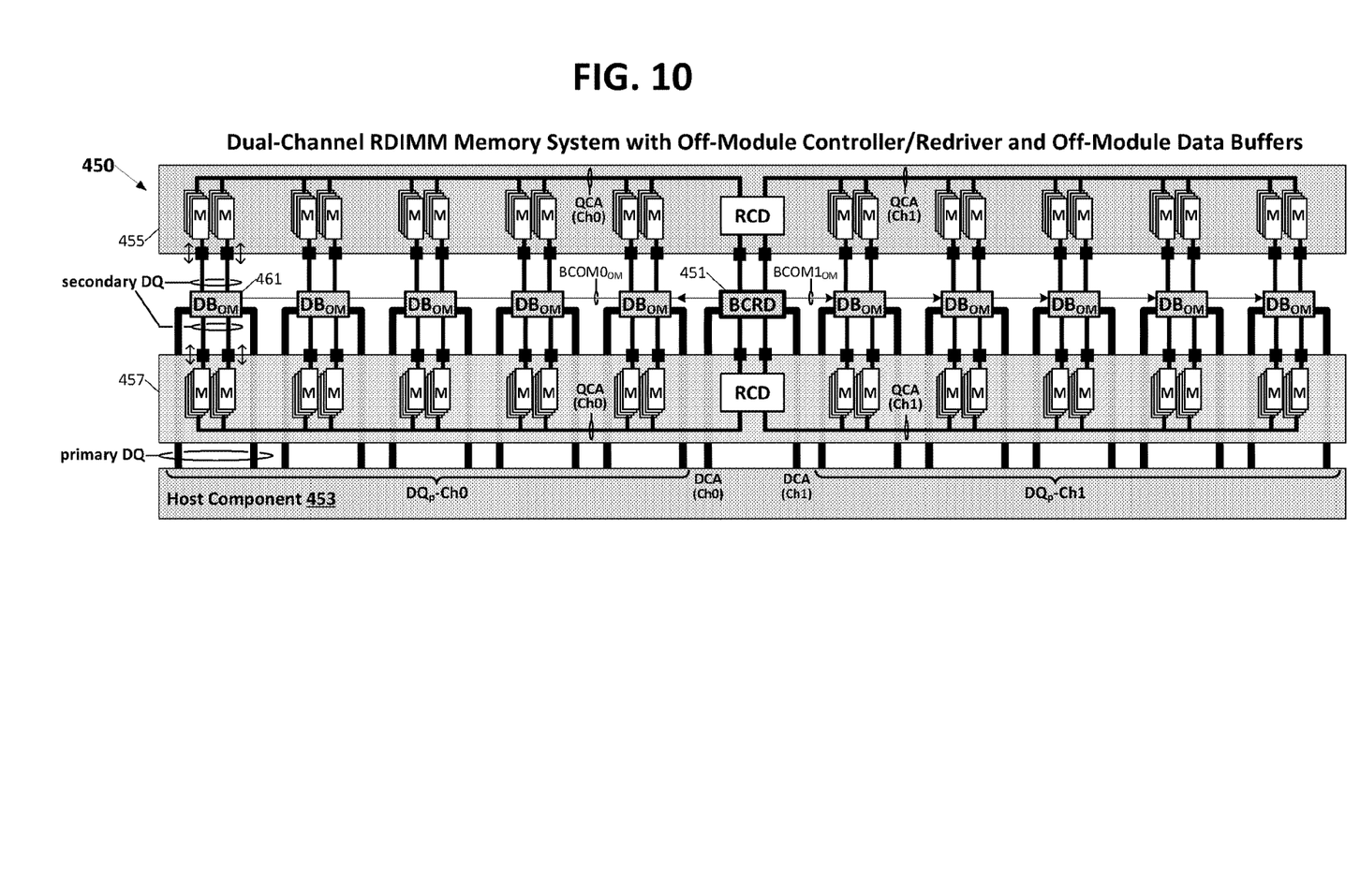
FIG. 10 illustrates an exemplary RDIMM (register dual inline memory module) memory system having an off-DIMM buffer controller/redriver disposed in the control path between a host component and two socketed RDIMMs.

FIG. 10 illustrates an exemplary RDIMM memory system 450 having (i) an off-DIMM buffer controller/redriver 451 (BCRD) disposed in the control path between a host component 453 and two socketed RDIMMs (455, 457), and (ii) off-DIMM data buffers 461 (DB$_{OD}$) disposed in the data path between the host component and RDIMM sockets. The RDIMM memory system wiring and off-module component dispositions and implementations are generally as discussed above (including the various alternative BCRD embodiments), with the exception of module-resident data buffer omission. Thus the off-module data buffers 461 interface directly to module-mounted memory components (and may each be split as shown in FIG. 8). Accordingly, the training operations shown in dashed outline in FIG. 6 for the interfaces between module-resident data buffers and off-DIMM data buffers (i.e., at 349 and 355) and for the on-module BCOM links (i.e., operation 341 of FIG. 6) may be omitted, and the training operations shaded in FIG. 6 for the interfaces between the module-mounted memory components and the module-resident data buffers shown at 347 and 353 are instead carried out as training between the module-mounted memory components and the off-DIMM data buffers to which they are directly connected.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, component counts, socket counts, etc. and/or any specific signaling rates, signaling bandwidths, operating frequencies and the like can be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A buffer integrated circuit (IC) comprising:
   a control interface to receive memory-module control signals from a host control component;
   a memory-module interface to receive the memory-module control signals from the control interface and to re-transmit the memory-module control signals to one or more socketed memory modules;
   control circuitry to snoop the memory-module control signals received via the control interface and to generate data-buffer control signals that correspond to the memory-module control signals; and
   a buffer control interface to receive the data-buffer control signals from the control circuitry and to transmit the data-buffer control signals to one or more off-module data buffer ICs disposed in a data path between the host control component and the one or more socketed memory modules to enable data transfer between the host control component and the one or more socketed memory modules.

2. The buffer IC of claim 1 wherein the control interface to receive the memory-module control signals comprises receiver circuits to receive chip-select signals and command/address signals synchronously with respect to a first clock signal, and wherein the memory-module interface to re-transmit the memory module control signals comprises signal driver circuits to transmit the chip-select signals and the command/address signals to the one or more socketed memory modules synchronously with respect to a second clock signal.

3. The buffer IC of claim 2 further comprising clock tree circuitry to generate the second clock signal in response to the first clock signal, and wherein the memory-module interface comprises clock transmitter circuitry to transmit the second clock signal to the one or more socketed memory modules.

4. The buffer IC of claim 2 wherein:
   each of the receiver circuits to receive the command/address signals synchronously with respect to the first clock signal comprises circuitry to receive respective command/address bits synchronously with each rising edge and each falling edge of the first clock signal such that two command/address bits are received via each of the receiver circuits per cycle of the first clock signal;
   each of the signal driver circuits to transmit the command/address signals synchronously with respect to the second clock signal comprises circuitry to transmit two command/address bits per cycle of the second clock signal; and
   the first and second clock signals have nominally the same frequency.

5. The buffer IC of claim 1 wherein the memory-module interface to re-transmit the memory-module control signals to the one or more socketed memory modules via the memory-module interface comprises circuitry to transmit the memory-module control signals to one or more register clock-driver (RCD) components disposed respectively on the one or more socketed memory modules.

6. The buffer IC of claim 1 wherein the control interface is further to receive signal training commands from the host control component and wherein the control circuitry responds to the signal training commands by executing, at least in part within the buffer IC, a signal training operation to enable reliable reception of the memory-module control signals via a high-signaling-rate portion the control interface.

7. The buffer IC of claim 1 wherein the control interface is further to receive signal training commands from the host control component and wherein the control circuitry responds to the signal training commands by executing, at least in part within the buffer IC, a signal training operation to enable the one or more socketed memory modules to reliably receive the memory-module control signals re-transmitted by the buffer IC via the memory-module interface.

8. The buffer IC of claim 1 wherein the control interface is further to receive signal training commands from the host control component and wherein the control circuitry responds to the signal training commands by executing, at least in part within the buffer IC, a signal training operation to adjust signal reception timing with respect to data signals conveyed between the one or more socketed memory modules and the off-module data buffer ICs.

9. The buffer IC of claim 1 wherein the control interface is further to receive signal training commands from the host control component and wherein the control circuitry responds to the signal training commands by executing, at least in part within the buffer IC, a signal training operation to adjust signal reception timing with respect to data signals conveyed between the host control component and the off-module data buffer ICs.

10. The buffer IC of claim 1 wherein the buffer control interface to transmit the data-buffer control signals to the one or more off-module data buffers to enable data transfer between the host control component and the one or more socketed memory modules comprises circuitry to transmit data-buffer control signals to the one or more off-module data buffers to form a multiplexed data transfer path between the host control component and a selected one of the one or more socketed memory modules.

11. A method of operation within a buffer integrated circuit (IC), the method comprising:
   receiving memory-module control signals from a host control component via a control interface;
   re-transmitting the memory-module control signals to one or more socketed memory modules via a memory-module interface;
   generating, by snooping the memory-module control signals received via the control interface, data-buffer control signals that correspond to the memory-module control signals; and
   transmitting the data-buffer control signals, via a buffer control interface, to one or more off-module data buffer ICs disposed in a data path between the host control component and the one or more socketed memory modules to enable data transfer between the host control component and the one or more socketed memory modules.

12. The method of claim 11 wherein receiving memory-module control signals comprises receiving chip-select signals and command/address signals synchronously with respect to a first clock signal, and wherein re-transmitting the memory module control signals comprises re-transmitting the chip-select signals and the command/address signals to the one or more socketed memory modules synchronously with respect to a second clock signal.

13. The method of claim 12 further comprising generating the second clock signal in response to the first clock signal and transmitting the second clock signal to the one or more socketed memory modules via the memory-module interface.

14. The method of claim 12 wherein:
receiving the memory-module control signals synchronously with respect to the first clock signal comprises receiving, at each signal input of the control interface, respective control bits synchronously with each rising edge and each falling edge of the first clock signal such that two control bits are received per signal input of the control interface per cycle of the first clock signal;
re-transmitting the memory module control signals via the memory-module interface comprises transmitting two control bits per signal output of the memory-module interface per cycle of the second clock signal; and
the first and second clock signals have nominally the same frequency.

15. The method of claim 11 wherein re-transmitting the memory-module control signals to the one or more socketed memory modules via the memory-module interface comprises retransmitting the memory-module control signals to one or more register clock-driver (RCD) components disposed respectively on the one or more socketed memory modules.

16. The method of claim 11 further comprising executing, at least in part within the buffer IC, a signal training operation to enable reliable reception of the memory-module control signals via the control interface.

17. The method of claim 11 further comprising executing, at least in part within the buffer IC, a signal training operation to enable the one or more socketed memory modules to reliably receive the memory-module control signals re-transmitted by the buffer IC via the memory-module interface.

18. The method of claim 11 further comprising executing, at least in part within the buffer IC, a signal training operation to adjust signal reception timing with respect to data signals conveyed between the one or more socketed memory modules and the off-module data buffer ICs.

19. The method of claim 11 further comprising executing, at least in part within the buffer IC, a signal training operation to adjust signal reception timing with respect to data signals conveyed between the host control component and the off-module data buffer ICs.

20. A buffer integrated circuit comprising:
means for receiving memory-module control signals from a host control component;
means for re-transmitting the memory-module control signals to one or more socketed memory modules;
means for generating, by snooping the memory-module control signals received via the control interface, data-buffer control signals that correspond to the memory-module control signals; and
means for transmitting the data-buffer control signals to one or more off-module data buffer ICs disposed in a data path between the host control component and the one or more socketed memory modules to enable data transfer between the host control component and the one or more socketed memory modules.

* * * * *